(12) United States Patent
Choi

(10) Patent No.: US 7,049,050 B2
(45) Date of Patent: May 23, 2006

(54) UPSIDE DOWN BAKE PLATE TO MAKE VERTICAL AND NEGATIVE PHOTORESIST PROFILE

(75) Inventor: Willys Choi, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 10/876,141

(22) Filed: Jun. 24, 2004

(65) Prior Publication Data

US 2004/0234905 A1 Nov. 25, 2004

Related U.S. Application Data

(63) Continuation of application No. 10/043,483, filed on Jan. 11, 2002, now Pat. No. 6,780,571.

(51) Int. Cl.
*G03C 5/00* (2006.01)

(52) U.S. Cl. .................. 430/311; 430/330; 430/322

(58) Field of Classification Search ................ None
See application file for complete search history.

(56) References Cited

U.S. PATENT DOCUMENTS

| | | |
|---|---|---|
| 4,653,860 A | 3/1987 | Hendrix |
| 4,800,251 A | 1/1989 | Matsuoka |
| 4,924,257 A | 5/1990 | Jain |
| 5,045,419 A | 9/1991 | Okumura |
| 5,138,368 A | 8/1992 | Kahn et al. |
| 5,578,127 A | 11/1996 | Kimura |
| 5,691,541 A | 11/1997 | Ceglio et al. |
| 5,849,435 A | 12/1998 | Akram et al. |
| 5,870,176 A | 2/1999 | Sweatt et al. |
| 5,877,076 A | 3/1999 | Dai |
| 6,100,506 A | 8/2000 | Colelli, Jr. et al. |
| 6,238,852 B1 | 5/2001 | Klosner |

OTHER PUBLICATIONS

E.G. Colgan et al. "On-chip Metalizzation Layer for Reflective Light Valves," IBM Journal of Research & Development, vol. 42, No. 3/4, 1998, IBM Centre for Advanced Studies, Website: www.research.ibm.com/journal/rd/423/colgan.html.

Thermal Reflow of Patterned Resist Without Via Shifting, Sep. 1, 1989, IBM Technical Disclosure Bulletin, vol. 32, pp. 149-152.

*Primary Examiner*—John A. McPherson
*Assistant Examiner*—Daborah Chacko-Davis
(74) *Attorney, Agent, or Firm*—Duane Morris LLP

(57) ABSTRACT

A new method is provided for exposing a semiconductor surface over which a photoresist mask has been created to elevated temperatures. Using conventional methods of wafer temperature exposure, the wafer is mounted on the surface of a hot plate with the active surface of the wafer, over which the photoresist mask has been created, facing upwards. The invention provides a method whereby the conventional upward position of the wafer during temperature exposure is changed. The wafer is, during temperature exposure, placed on the surface of a hot plate, the hot plate is then positioned under an angle with a horizontal direction and may, under the invention, be turned such that the active surface of the wafer, over which a photoresist mask has been formed, faces downwards.

12 Claims, 2 Drawing Sheets

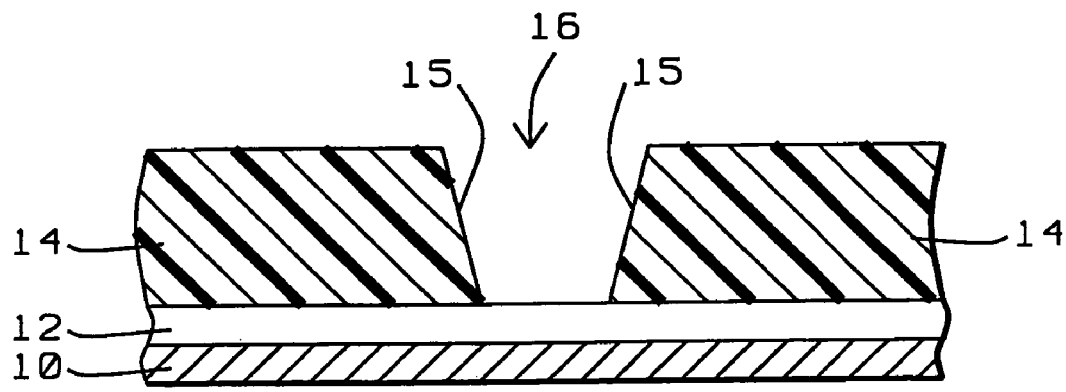
FIG. 1A – Prior Art
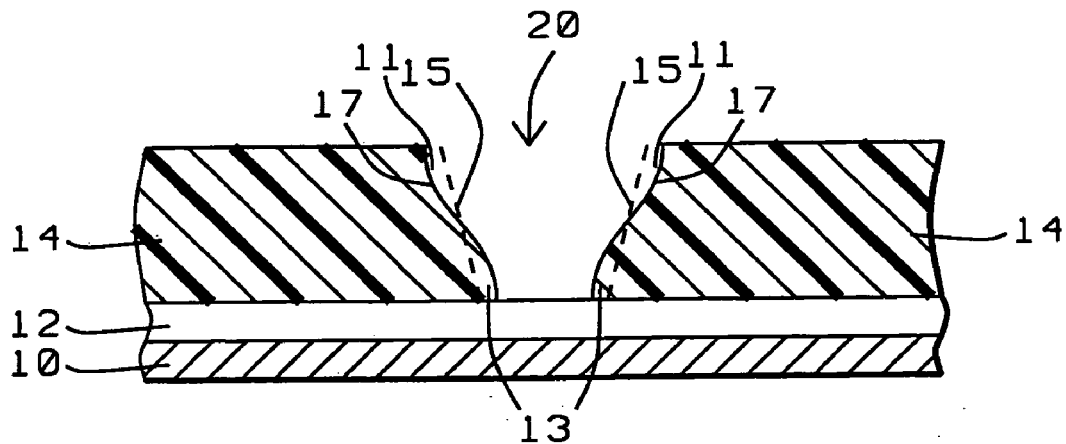
FIG. 1B – Prior Art
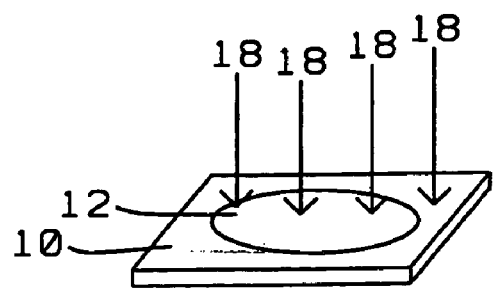
FIG. 1C – Prior Art

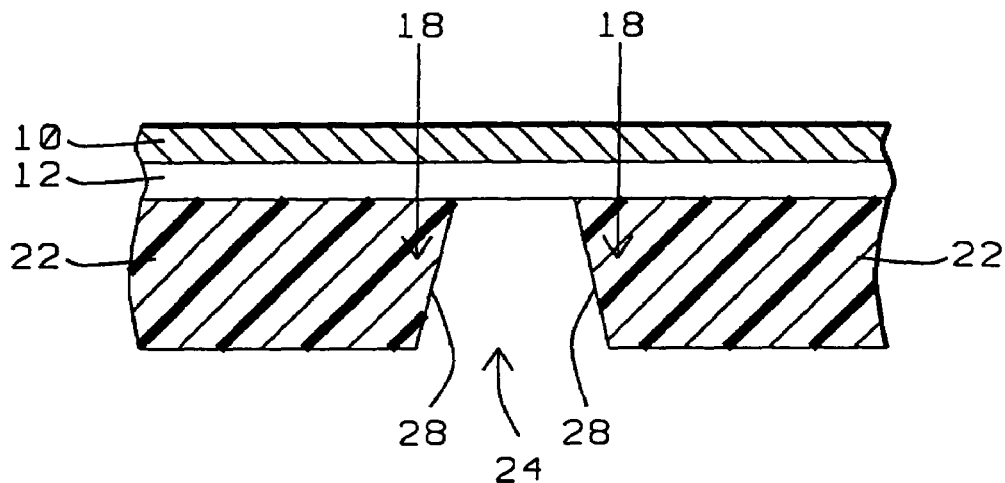
FIG. 2A
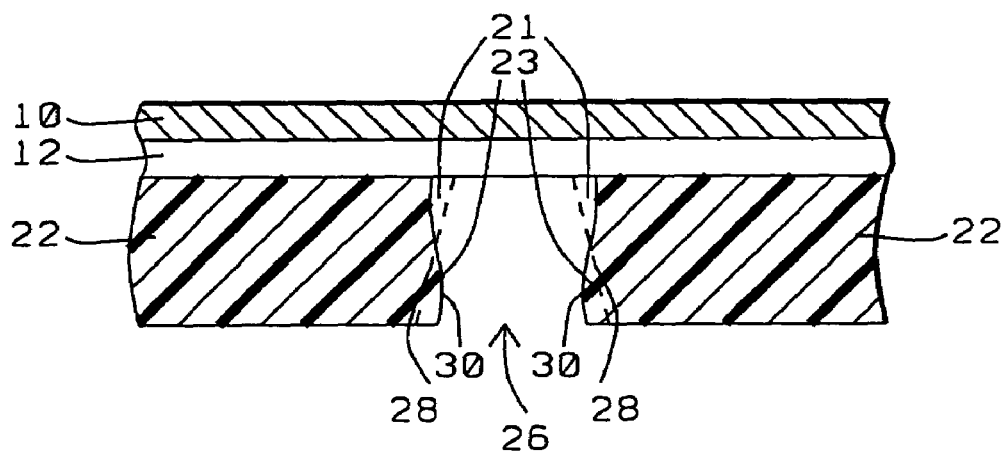
FIG. 2B – Prior Art
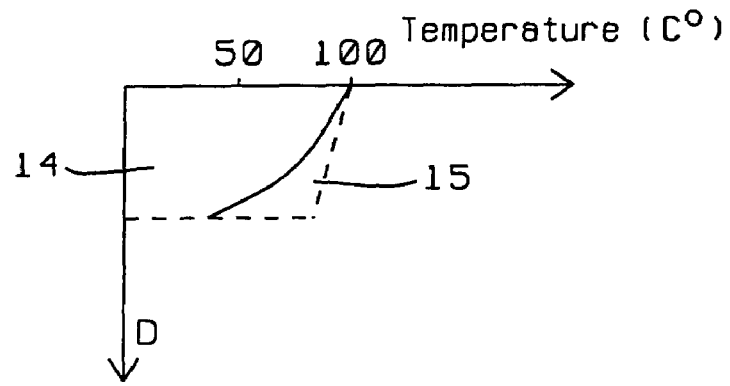
FIG. 2C

UPSIDE DOWN BAKE PLATE TO MAKE VERTICAL AND NEGATIVE PHOTORESIST PROFILE

CROSS-REFERENCE TO RELATED APPLICATION

This application is a continuation of U.S. patent application Ser. No. 10/043,483 filed Jan. 11, 2002, now U.S. Pat. No. 6,780,571, the entirety of which is hereby incorporated herein by reference.

BACKGROUND OF THE INVENTION (1) Field of the Invention

The invention relates to the fabrication of integrated circuit devices, and, more particularly, to a method for making vertical and negative profiles in a patterned layer of photoresist.

(2) Description of the Prior Art

Photolithography is a common and well known approach whereby patterned layers of semiconductor material are typically formed by spinning a layer of photoresist over the surface of the semiconductor material, projecting light through a photomask having the desired pattern onto the layer of photoresist to expose the photoresist to the pattern, developing the photoresist, washing off the undeveloped photoresist and plasma etching to clean out the areas where the photoresist has been washed away. The exposed resist may be rendered soluble (positive working) and form the pattern, or insoluble (negative working) and be washed away. In either case, the remaining resist on the surface of the semiconductor material forms the desired pattern. The application of photoresist brings with it exposure of the processing environment to contamination from photoresist particulates and etchant solutions. To avoid this, dry etches may be employed but dry etches are expensive due to the high capitol cost Reactive Ion Etch (RIE) system and are limited in application because they require a hard mask such as nickel, aluminum or gold. Regardless of the material that is used for underlying conductive interconnects or the patterning techniques that are applied, planarization of the interlayer dielectric is crucial for obtaining a multilevel structure that allows accurate lithographic patterning. The deposition and etchback tolerances associated with large film thickness are cumulative, and any non-planarity of the photoresist is replicated in the final top surface of the device. Chemical-mechanical polishing is a fast and efficient approach for achieving planarity in multichip modules and integrated circuits.

One of the aspects that is associated with the use of photoresist is the stability of the applied layer of resist. Stability of a photoresist layer relates to its resistance to degradation of exposure and processing characteristics when the film is exposed to oxidants such as ambient oxygen after the film is removed from the deposition chamber. Typically, in commercial processes the film may not be developed immediately after exposure. Thus, if the film is not stable, the exposed pattern will degrade before the film is developed. High photosensitivity is required in commercial processes so that a short exposure time can be utilized for each substrate. In addition, high deposition rate of the deposited layer of photoresist is required for high throughput.

Wet etching is a frequently used technique for stripping photoresist films from silicon wafers where a complete removal of the resist images without adversely affecting the wafer surface is desired. The resist layer or images should he completely removed without leaving any residues, including contaminant particles that may have been present in the resist. The underlying surface of the photoresist layer should not be adversely affected, for instance, undesirable etching of the metal or oxide surface should he avoided. It is also desirable that the etching or stripping time should be reasonably short to permit a high wafer throughput.

It is for purposes of performance improvement frequently required to expose a surface over which a layer of photoresist has been deposited to elevated temperatures in order to improve processing conditions for the semiconductor device. Where this temperature exposure exceeds a limit of temperature, the layer of photoresist has a tendency to reflow. The invention uses photoresist reflow and provides a method where the wafer can be exposed to elevated temperatures for purposes of changing the profile of the openings created in the developed layer of photoresist. A conventional negative profile, with outwards sloping sidewalls, can be changed to a positive profile, with inwards sloping sidewalls or a profile having vertical sidewalls.

U.S. Pat. No. 5,849,435 (Akram et al.) shows a process, which inverts a wafer with resist and then hardens.

U.S. Pat. No. 6,100,506 (Colelli, Tr. et al.) shows a photoresist bake using a right side up hot plate.

U.S. Pat. No. 5,578,127 (Kimura) shows a coat and bake photoresist system.

U.S. Pat. No. 4,800,251 (Matsuoka) and U.S. Pat. No. 5,877,076 (Dai) are related processes with bakes and hot plates.

SUMMARY OF THE INVENTION

A principle objective of the invention is to provide a method that allows for the exposure of a wafer that is being processed to elevated temperatures without introducing harmful photoresist flow.

Another objective of the invention is to provide a method for creating a pattern in a layer of photoresist having improved vertical sidewalls.

Yet another objective of the invention is to provide a method for the creation of high resolution patterns of interconnect metal by changing a negative profile of elements of the pattern of photoresist mask to a positive profile.

A still further objective of the invention is to provide a method for the creation of a pattern in the layer of photoresist that has positive sloping sidewalls.

In accordance with the objectives of the invention a new method is provided for exposing a semiconductor surface over which a photoresist mask has been created to elevated temperatures. Using conventional methods of wafer temperature exposure, the wafer is mounted on the surface of a hot plate with the active surface of the wafer, over which the photoresist mask has been created, facing upwards. The invention provides a method whereby the conventional upward position of the wafer during temperature exposure is changed. The wafer is, during temperature exposure, placed on the surface of a hot plate, the hot plate is then positioned under an angle with a horizontal direction and may, under the invention, be turned such that the active surface of the wafer, over which a photoresist mask has been formed, faces downwards.

BRIEF DESCRIPTION OF THE DRAWINGS

FIGS. 1a through 1c show cross sections and a three dimensional view of conventional methods of heating a substrate.

FIGS. 2a and 2b show cross sections of the method of the invention for heating a substrate, FIG. 2c shows a temperature distribution chart.

DESCRIPTION OF THE PREFERRED EMBODIMENTS

The following can be cited as an example of the use of one or more layers of photoresist. Connections between metal levels, such as levels comprising copper, which are separated by dielectric inter-levels, are typically formed with a damascene method of via formation between metal levels. The underlying copper level is first completely covered with a dielectric, a typical dielectric is silicon dioxide. A patterned photoresist profile is then formed over the dielectric, and an interconnection trench is etched into the dielectric. Another layer of photoresist has an opening, or hole, in the photoresist overlying the trench, corresponding to the area in the dielectric where the via is to be formed. The dielectric that is not covered with photoresist is then etched to remove oxide underlying the hole in the photoresist. The photoresist is then stripped away. A thin film of copper, or some other metallic material, is then used to fill the via and the trench. A layer consisting of a dielectric with a copper via through it is now overlying the copper film. The excess copper remaining is now removed with a CMP process. The result is an inlaid or damascene structure.

The use of RIE has allowed the industry to successfully transfer small images in photoresist to underlying metal. The major advantage of RIE processing is the anisotropic component of this etching technique. The low pressure associated with RIE drastically reduces most isotropic aspects, and therefore allows a less tapered or less undercut profile to be obtained. However the use of RIE also demands that a high selectivity exists between the material being patterned, such as aluminum, and an underlying material, such as silicon dioxide. It is in this case also desirable that the removal rate of the masking photoresist be much smaller than the removal rate of aluminum. Therefore the chemistry used for RIE processing has to be carefully selected and developed to successfully produce the images needed in VLSI technology.

As the downscaling in device feature sizes continues, the creation of these device features experiences a number of problems. With the further decrease in linewidth and decrease in the diameter of the openings that are created in semiconductor devices, the supporting photolithography technology has met these challenges by decreasing the wavelength of the photo exposure. The photo exposure is used to create the patterned layers of photoresist, which are used to define the dimensions of the linewidth and the openings that are created in for instance layers of dielectric or etch stop layers. Currently, photo exposure radiation using Near Ultra-Violet (NUV) exposure with a wavelength of 365 nm is applied this enables the creation of device features down to the 0.35~m range. The most advanced photo exposure techniques use Deep Ultra Violet (DUV) exposure with a wavelength of 245 nm that enables the creation of device features down to the 0.18~m range. While the photolithography technology will continue to increase its exposure capabilities in support of decreasing device feature sizes, it is also important to provide methods and materials that further assist in the reduction of semiconductor device features. These methods will assist and facilitate design efforts and advances in the field of photolithography that combined will enable future progress in reducing device features and, with that, progress in improved device performance.

In order to better understand the invention, the problems that are encountered using conventional methods of heat exposure of a wafer are first briefly reviewed using FIGS. 1a through 1c.

Referring specifically to FIG. 1a, there is shown a cross section of a surface over which a patterned and developed layer of photoresist has been created. The elements that are highlighted in the cross section of FIG. 1a are the following:

- 10, a hot plate that is used to expose a thereover mounted wafer to elevated temperatures
- 12, a wafer which is mounted on the surface of hot plate 10 with the objective of raising the temperature of wafer 12
- 14, a patterned and developed layer of photoresist that forms a photomask over the surface of wafer 12; it is implied that the photomask is created with the objective of exposing an underlying layer of semiconductor material, as has been highlighted in some detail above; layers of semiconductor material that are not germane to the invention are not shown in the cross section of FIG. 1a since such a detailed composition does not add to an explanation of the invention
- 15, the sidewalls of opening 16
- 16, an opening that has been created in the layer 14 of photoresist, converting an unexposed and undeveloped layer 14 of photoresist into a photoresist mask for pattern creation in an underlying layer (not shown).

It must be noted that the sidewalls 15 of the opening 16 that has been created through layer 14 have a sloping profile, intersection the surface of wafer 12 under an angle that is less than 90 degrees. The profile of the opening 16 is referred to as a positive profile whereby, as is clear from the cross section of FIG. 1a, the opening in the surface of the layer 14 has a larger diameter than the bottom of the opening 16 where this opening intersects with the surface of the wafer.

The change in the profile of opening 16 and the manner in which this change occurs is shown in the cross section of FIG. 1b. The change in the profile of the photo mask can be predicted by considering the results of heating the developed layer 14 of photoresist: the unsupported photoresist will "flow down" in the surface areas where the support is minimal, that is in the intersects of sidewalls 15 with the surface of the developed layer 14. The material that is removed in this manner must go to another location and consequently flows down along the general outline of the sidewalls 15 toward the lower extremities of these sidewalls. In this manner, the new sidewalls 17 that have been highlighted in the cross section of FIG. 1b are formed. Flow of photoresist has occurred from regions 11 to regions 13.

The new sidewalls have been shown in the cross section of FIG. 1b as being essentially symmetrical and of equal and inverted profile. This does however not have to be that way since a number of uncontrolled parameters playa role in the formation of the new profile. For instance, density of the layer of photoresist or differences in temperature at the points where the photoresist flows. Any difference between the inverted profiles of sidewalls 17 are however not of key importance. What is of importance is that the original sidewalls 15 have changed to sidewalls 17, and this in an uncontrolled and unpredictable manner. This change in the sidewalls of opening 16 must be avoided.

It must further be pointed out that the flow of the photoresist as discussed using the cross section of FIG. 1b has resulted in an opening 20 that now has a larger top surface diameter than the original opening 16 of FIG. 1a. This is counteractive to the design requirement of being able to create ever-denser patterns of openings, which are required for future technologies having devices of sub-micron device features.

For reasons of clarity, FIG. 1c shows a three-dimensional view of the wafer as the wafer 12 is mounted over the hot plate 10. Of significance in the three dimensional view of FIG. 1c is that the gravity force 18 intersects with the plane of wafer 12 under an angle of 90 degrees, causing the reflow of the photoresist 14 when this resist is exposed to elevated temperatures that has been shown in cross section in FIG. 1b.

The invention is further explained using FIGS. 2a and 2b. Shown in the cross section of FIG. 2a are:
- 10, a hot plate that is used to expose a thereover mounted wafer to elevated temperatures
- 12, a wafer which is mounted on the surface of hot plate 10 with the objective of raising the temperature of wafer 12
- 22, a patterned and developed layer of photoresist that forms a photomask over the surface of wafer 12; it is implied that the photomask is created with the objective of exposing an underlying layer of semiconductor material, as has been highlighted in some length above; layers of semiconductor material that are not germane to the invention are not shown in the cross section of FIG. 2a since such a detailed composition does not add to the explaining the invention
- 28, the sidewalls of opening 16
- 24, an opening that has been created in the layer 22 of photoresist, converting an unexposed and undeveloped layer 22 of photoresist into a photoresist mask for pattern creation in an underlying layer (not shown), and
- 18, gravity pull as it is exerted specifically on the patterned and developed layer 22 of photoresist.

The cross section that is shown in FIG. 2b shows the effect that gravity force 18 has on the heated layer 22 of photoresist. Following the same reasoning as previously applied to the cross sections of FIGS. 1a and 1b, it is clear that the conclusion will be reached that photoresist material will move from region 21 to region 23 in the cross section of FIG. 2b.

The temperature profile that is established throughout layer 22 of photoresist is shown in FIG. 2c, from which can be learned that the highest temperature exists in regions 21 since these regions are located closest to hot plate 10. It therefore stands to reason that the photoresist will first reflow in these regions 21. At the time that the reflow takes place, the photoresist is pulled down by the gravity force 18 and is removed from the highlighted regions 21 and accumulates in regions 23.

An additional parameter of control can be used during the highlighted process, this is the temperature of the hard bake that is applied to a deposited layer of photoresist. The process that has been described as the process of the invention has generally taken the glass transition temperature TG as the temperature above which reflow of the photoresist takes place. It must be experimentally determined which temperature is best suited in order to achieve desired results.

From the cross section that is shown in FIG. 2b, two observations are in place:
- the positive profile of the opening 26 through the layer 22 of photoresist, where sidewalls 28 of an opening 26 through the layer 22 of photoresist slope outwards when proceeding from the bottom to the top of the opening, has been converted to a negative profile, where sidewalls 30 of an opening 26 through the layer 22 of photoresist slope inwards when proceeding from the bottom to the top of the opening
- by control of temperature and time of exposure to the temperature, it is possible to convert a positive profile to a vertical profile, where sidewalls of an opening through the layer of photoresist intersect under an angle of essentially 90 degrees with the surface of the wafer, and
- a combination of negative and vertical profile can be created.
- the cross section of the opening 26 where this opening exists layer 22 has been reduced in size, thus enabling closer spacing of adjacent holes.

As a final comment must be pointed out that, where the cross section of FIGS. 2a and 2b show the active surface of the wafer over which the photo mask has been formed to be facing downwards, the invention is not limited to a complete downward turning of the active surface of the substrate. The angle of intersection between the surface of the substrate, during the process of heating the substrate, and a horizontal direction can be selected and adjusted for optimum results of modification of the profile of the opening created through a layer of photoresist.

The sequence of the processing steps of the invention is as follows:
1. coating of the layer of photoresist over the active surface of a substrate
2. patterning and developing of the layer of photoresist
3. mounting the substrate, over the surface of which the patterned and developed layer of photoresist has been created, on the surface of a hot plate with the active surface of the substrate facing upwards
4. placing the hot place in an upside-down position, thereby facing the active surface of the substrate in a downward position
5. baking, during a period of time, the substrate by applying heat to the hot plate, the temperature that is introduced into the heated substrate is essentially higher than the glass transition temperature TG
6. terminating applying heat to the hot plate, and
7. cooling the substrate while the substrate is in an upwards-down position.

The invention, which provides a method of modifying a slope of sidewalls of openings created in a layer of photoresist, can additionally be summarized as follows:
- providing a substrate, the substrate having been provided with semiconductor devices, at least one layer of semiconductor material having been deposited over the substrate, the at least one layer of semiconductor material being patterned for creation of additional functional capabilities of the semiconductor devices
- coating a layer of photoresist over the at least one layer of semiconductor material
- patterning the layer of photoresist, creating at least one opening through the layer of photoresist having sidewalls, the at least one opening comprising a via hole and an interconnect line
- providing a hot plate having a first and second surfaces
- mounting the substrate on the second surface of the hot plate, the second surface facing in about an upward direction
- placing the hot plate in about an upwards-down position, thereby facing the second surface of the hot plate in about a downwards direction, the second surface of the hot plate being about parallel with a horizontal plane, the horizontal plane coinciding with a plane of the earth's surface
- applying energy in the form of heat to the hot plate, thereby supplying energy in the form of heat to the substrate and to the patterned layer of photoresist created over the substrate, the energy being applied for a first period of time discontinuing the application of energy in the form of heat, thereby discontinuing supplying energy in the form of heat to the substrate and to the patterned layer of photoresist, the discontinuing being applied for a second period of time placing the hot plate in about an upwards position, thereby facing the second surface of the hot plate in about an upwards direction, the second surface of the hot plate being about parallel with a horizontal plane, the horizontal plane coinciding with the plane of the earth's surface, creating a modified layer of photoresist having openings of modified slopes of sidewalls of the openings, and continuing with conventional processing, using the modified layer of photoresist for the patterning of the at least one layer of semiconductor material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of modifying a slope of sidewalls of openings created in a layer of photoresist, comprising:

coating a layer of photoresist over at least one layer of semiconductor material formed over a substrate;

patterning said layer of photoresist, creating at least one opening through said layer of photoresist having sidewalls, said at least one opening comprising a via hole and/or an interconnect line trench;

providing a hot plate having first and second surface said first surfaces, being opposite said second surface;

mounting said substrate on said second surface of said hot plate;

applying energy in the form of heat to said hot plate for a first period of time, thereby supplying energy in the form of heat to said patterned layer of photoresist, while said second surface is oriented in a downwards position to at least about face a horizontal plane coinciding with a plane of the earth's surface;

after said first period of time, orienting said hot plate in an upwards position opposite said downwards position, thereby creating a modified layer of photoresist having openings of modified slopes of sidewalls of said openings; and patterning said at least one layer of semiconductor material using said modified layer of photoresist.

2. The method of claim 1, said applying energy in the form of heat step comprises raising a temperature of said patterned layer of photoresist to at least a glass transition temperature $T_g$.

3. A method of changing Critical Dimension in a layer of photoresist that is used for patterning at least one layer of semiconductor material comprising the steps of:

creating a patterned layer of photoresist having a surface formed over at least one layer of semiconductor material formed over a substrate, said patterned layer of photoresist having at least one opening formed therethrough having sidewalls having an angle of intersect with said at least one layer of semiconductor material, said at least one opening comprising a via hole and/or an interconnect line trench; and changing said angle of intersect of said sidewalls of said at least one opening in said patterned layer of photoresist by raising a temperature of said patterned layer of photoresist while placing said surface of said patterned layer of photoresist under an angle with a horizontal plane, said horizontal plane coinciding with a plane of the earth's surface, thereby forming a modified layer of photoresist.

4. The method of claim 3, wherein said raising a temperature step comprises:

providing a hot plate having first and second surfaces;

mounting said substrate to the second surface of said hot plate; and applying energy in the form of heat to said hot plate for a first period of time, thereby supplying energy in the form of heat to said patterned layer of photoresist.

5. The method of claim 4, further comprising, after said changing step, patterning said at least one layer of semiconductor material using said modified layer of photoresist.

6. The method of claim 3, wherein said placing said surface of said patterned layer of photoresist under an angle with a horizontal plane step, comprises:

providing a hot plate having first and second surfaces;

mounting said substrate on the second surface of said hot plate, said second surface facing in a first direction; and reorienting said hot plate such that said second surface faces in a second direction.

7. The method of claim 6, wherein said first direction is about an upward direction parallel with said horizontal plane and said second direction is any direction not comprising the upward direction.

8. A method of reducing pitch of via openings that are created through a layer of dielectric, comprising the steps of:

creating a patterned layer of photoresist having a surface formed over at least one layer of dielectric, said patterned layer of photoresist having at least one opening through said layer of photoresist having sidewalls having an angle of intersect with said at least one layer of semiconductor dielectric, said at least one opening comprising a via opening and/or interconnect line trench; and changing said angle of intersect of said sidewalls of said at least one opening in said patterned layer of photoresist by raising a temperature of said patterned layer of photoresist while placing said surface of said patterned layer of photoresist under an angle with a horizontal plane, said horizontal plane coinciding with a plane of the earth's surface, thereby forming a modified layer of photoresist.

9. The method of claim 8, wherein said raising a temperature step comprises:

providing a hot plate having first and second surfaces;

mounting said substrate to the second surface of said hot plate; and applying energy in the form of heat to said hot plate for a first period of time, thereby supplying energy in the form of heat to said patterned layer of photoresist.

10. The method of claim 9, further comprising, after said changing step, patterning said at least one layer of dielectric material using said modified layer of photoresist.

11. The method of claim 8, wherein said placing said surface of said patterned layer of photoresist under an angle with a horizontal direction, comprises:

providing a hot plate having first and second surfaces;

mounting said substrate on the second surface of said hot plate, said second surface facing in a first direction; and reorienting said hot plate such that said second surface in a second direction.

12. The method of claim 11, wherein said first direction is about an upward direction parallel with said horizontal plane and said second direction is any direction not comprising the upward direction.

* * * * *

UNITED STATES PATENT AND TRADEMARK OFFICE
CERTIFICATE OF CORRECTION

| | | |
|---|---|---|
| PATENT NO. | : 7,049,050 B2 | Page 1 of 1 |
| APPLICATION NO. | : 10/876141 | |
| DATED | : May 23, 2006 | |
| INVENTOR(S) | : Willys Choi | |

It is certified that error appears in the above-identified patent and that said Letters Patent is hereby corrected as shown below:

Column 3, line 55, delete "~m" and insert therefor --$\mu$m--;

Column 3, line 58, delete "~m" and insert therefor --$\mu$m--;

Column 7, line 34, delete "surface" and insert therefor --surfaces--;

Column 7, line 35, delete "surfaces" and insert therefor --surface--; and

Column 8, line 61, insert "faces" after the word surface.

Signed and Sealed this

Ninth Day of January, 2007

JON W. DUDAS
*Director of the United States Patent and Trademark Office*